(12) United States Patent
Chang

(10) Patent No.: US 9,627,339 B2
(45) Date of Patent: Apr. 18, 2017

(54) METHOD OF FORMING AN INTEGRATED CIRCUIT DEVICE INCLUDING A PILLAR CAPPED BY BARRIER LAYER

(71) Applicant: TAIWAN SEMICONDUCTOR MANUFACTURING COMPANY, LTD., Hsinchu (TW)

(72) Inventor: Wei Sen Chang, Jinsha Township (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/844,268

(22) Filed: Sep. 3, 2015

(65) Prior Publication Data
US 2015/0380371 A1  Dec. 31, 2015

Related U.S. Application Data

(60) Division of application No. 14/153,126, filed on Jan. 13, 2014, now Pat. No. 9,142,521, which is a
(Continued)

(51) Int. Cl.
*H01L 21/60* (2006.01)
*H01L 23/00* (2006.01)

(52) U.S. Cl.
CPC .............. *H01L 24/11* (2013.01); *H01L 24/13* (2013.01); *H01L 2224/0401* (2013.01); *H01L 2224/05572* (2013.01); *H01L 2224/05647* (2013.01); *H01L 2224/10126* (2013.01); *H01L 2224/10145* (2013.01); *H01L 2224/1132* (2013.01); *H01L 2224/1145* (2013.01); *H01L 2224/1146* (2013.01); *H01L 2224/1147* (2013.01); *H01L 2224/11462* (2013.01);
(Continued)

(58) Field of Classification Search
None
See application file for complete search history.

(56) References Cited

U.S. PATENT DOCUMENTS 6,627,824 B1  9/2003  Lin
6,681,982 B2  1/2004  Tung
(Continued)

OTHER PUBLICATIONS

Islam, M. N., et al., "Comparative Study of the Dissolution Kinetics of Electrolytic Ni and Electroless Ni-P by the Molten Sn3.5Ag0.5Cu Solder Alloy", Microelectronics Reliability 43 (2003), pp. 2031-2037.

*Primary Examiner* — Thao P Le
(74) *Attorney, Agent, or Firm* — Hauptman Ham, LLP

(57) ABSTRACT

A method of forming an integrated circuit device includes forming a mask layer overlying an under bump metallurgy (UBM) layer, wherein the mask layer comprises a first portion adjacent to the UBM layer, and a second portion overlying the first portion. The method further includes forming an opening in the mask layer to expose a portion of the UBM layer. The method further includes forming a conductive layer in the opening of the mask layer, electrically connected to the exposed portion of the UBM layer. The method further includes removing the second portion of the mask layer to expose an upper portion of the conductive layer. The method further includes forming a barrier layer on the exposed upper portion of the conductive layer.

20 Claims, 4 Drawing Sheets

US 9,627,339 B2

Page 2

Related U.S. Application Data continuation of application No. 13/543,609, filed on Jul. 6, 2012, now Pat. No. 8,653,659, which is a division of application No. 12/832,205, filed on Jul. 8, 2010, now Pat. No. 8,232,193.

(52) U.S. Cl.
CPC ............ *H01L 2224/11464* (2013.01); *H01L 2224/11823* (2013.01); *H01L 2224/11825* (2013.01); *H01L 2224/11849* (2013.01); *H01L 2224/11906* (2013.01); *H01L 2224/13083* (2013.01); *H01L 2224/13109* (2013.01); *H01L 2224/13111* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/13565* (2013.01); *H01L 2224/13566* (2013.01); *H01L 2224/13609* (2013.01); *H01L 2224/13611* (2013.01); *H01L 2224/13639* (2013.01); *H01L 2224/13644* (2013.01); *H01L 2224/13655* (2013.01); *H01L 2224/13664* (2013.01); *H01L 2924/00013* (2013.01); *H01L 2924/00014* (2013.01); *H01L 2924/0103* (2013.01); *H01L 2924/014* (2013.01); *H01L 2924/0104* (2013.01); *H01L 2924/0105* (2013.01); *H01L 2924/01012* (2013.01); *H01L 2924/01013* (2013.01); *H01L 2924/01019* (2013.01); *H01L 2924/01022* (2013.01); *H01L 2924/01023* (2013.01); *H01L 2924/01024* (2013.01); *H01L 2924/01025* (2013.01); *H01L 2924/01028* (2013.01); *H01L 2924/01029* (2013.01); *H01L 2924/0132* (2013.01); *H01L 2924/01032* (2013.01); *H01L 2924/0133* (2013.01); *H01L 2924/01033* (2013.01); *H01L 2924/01038* (2013.01); *H01L 2924/01046* (2013.01); *H01L 2924/01047* (2013.01); *H01L 2924/01049* (2013.01); *H01L 2924/01073* (2013.01); *H01L 2924/01078* (2013.01); *H01L 2924/01079* (2013.01); *H01L 2924/01082* (2013.01); *H01L 2924/01327* (2013.01); *H01L 2924/1305* (2013.01); *H01L 2924/13091* (2013.01); *H01L 2924/14* (2013.01)

(56) References Cited

U.S. PATENT DOCUMENTS

| | | | |
|---|---|---|---|
| 7,008,867 | B2 | 3/2006 | Lei |
| 7,276,801 | B2 | 10/2007 | Dubin et al. |
| 7,476,564 | B2 | 1/2009 | Chen et al. |
| 7,956,442 | B2 | 6/2011 | Hsu et al. |
| 8,324,738 | B2 | 12/2012 | Liu et al. |
| 8,405,199 | B2 | 3/2013 | Lu et al. |
| 8,441,124 | B2 | 5/2013 | Wu et al. |
| 8,492,891 | B2 * | 7/2013 | Lu ............ H01L 24/11 257/692 |
| 8,653,659 | B2 | 2/2014 | Chang |
| 9,048,135 | B2 * | 6/2015 | Hwang ............ H01L 24/11 |
| 2001/0012542 | A1 | 8/2001 | Takahashi et al. |
| 2001/0040290 | A1 | 11/2001 | Sakurai et al. |
| 2005/0032349 | A1 | 2/2005 | Lee et al. |
| 2006/0094226 | A1 | 5/2006 | Huang et al. |
| 2007/0184579 | A1 | 8/2007 | Huang et al. |
| 2008/0048320 | A1 | 2/2008 | Lee et al. |
| 2008/0230896 | A1 | 9/2008 | Zhong et al. |
| 2009/0233436 | A1 | 9/2009 | Kim et al. |
| 2010/0109159 | A1 | 5/2010 | Ho et al. |
| 2010/0308443 | A1 | 12/2010 | Suthiwongsunthorn et al. |
| 2011/0049706 | A1 | 3/2011 | Huang et al. |
| 2011/0169158 | A1 | 7/2011 | Varanasi |
| 2011/0233761 | A1 | 9/2011 | Hwang et al. |
| 2011/0254159 | A1 | 10/2011 | Hwang et al. |
| 2011/0260317 | A1 | 10/2011 | Lu et al. |
| 2011/0266667 | A1 | 11/2011 | Wu et al. |
| 2011/0278716 | A1 | 11/2011 | Hsu et al. |
| 2011/0298123 | A1 * | 12/2011 | Hwang ............ H01L 24/05 257/737 |
| 2012/0007231 | A1 | 1/2012 | Chang |
| 2012/0280388 | A1 * | 11/2012 | Wu ............ H01L 21/76852 257/737 |
| 2014/0124924 | A1 * | 5/2014 | Chang ............ H01L 24/11 257/737 |

* cited by examiner

METHOD OF FORMING AN INTEGRATED CIRCUIT DEVICE INCLUDING A PILLAR CAPPED BY BARRIER LAYER

PRIORITY CLAIM

The present application is a divisional of U.S. application Ser. No. 14/153,126, filed Jan. 13, 2014, which is a continuation of U.S. application Ser. No. 13/543,609, filed Jul. 6, 2012, now U.S. Pat. No. 8,653,659, issued Feb. 18, 2014, which is a divisional of U.S. application Ser. No. 12/832,205, filed Jul. 8, 2010, now U.S. Pat. No. 8,232,193, issued Jul. 31, 2012, the disclosures of which are hereby incorporated by reference herein in their entireties.

RELATED APPLICATIONS

The present application is related to co-pending U.S. filing Ser. No. 12/765,250 filed on Apr. 22, 2010, which is expressly incorporated by reference herein in its entirety.

TECHNICAL FIELD

This disclosure relates to integrated circuit fabrication, and more particularly, to methods of forming bump structures in integrated circuit devices.

BACKGROUND

Modern integrated circuits are made up of literally millions of active devices, such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective chip. Electrical connections are made through bond pads to connect the chip to a package substrate or another die. Bond pads can be used for wire bonding or flip-chip bonding. Flip-chip packaging utilizes bumps to establish electrical contact between a chip's I/O pads and the substrate or lead frame of the package. Structurally, a bump actually contains the bump itself and a so-called under-bump-metallurgy (UBM) located between the bump and an I/O pad. An UBM generally contains an adhesion layer, a barrier layer and a wetting layer, arranged in that order, on the I/O pad. The bumps themselves, based on the material used, are classified as solder bumps, gold bumps, copper pillar bumps and bumps with mixed metals. Recently, copper pillar bump technology has been proposed. Instead of using a solder bump, the electronic component is connected to a substrate by means of a copper pillar bump, which achieves finer pitch with minimum probability of bump bridging, reduces the capacitance load for the circuits, and allows the electronic component to perform at higher frequencies.

Copper has a tendency to be oxidized during the manufacturing process. Oxidized copper pillars may lead to poor adhesion of an electronic component to a substrate. The poor adhesion may cause serious reliability concerns due to high leakage currents. Oxidized copper pillars may also lead to underfill cracking along the interface of the underfill and the copper pillars. The cracks may propagate to the underlying low dielectric constant (low-k) dielectric layers or to the solder used to bond the copper pillars to the substrate. A sidewall protection layer is therefore needed to prevent copper oxidation, but the conventional method of processing the Cu pillar sidewall suffers from high process costs and interface delamination issues. Particularly, after a solder joint process, it is observed that the solder material wets onto the exposed sidewall areas of the Cu pillar and under-bump metallurgy (UBM), which causes an intermetallic compound (IMC) to growing during temperature cycling. As the thickness of IMC increases, the solder joint becomes more vulnerable to cracks generated in the solder material. This is a challenge for fine pitch package technology in new generation chips. The current process employs an immersion tin (Sn) process to provide a tin layer on the Cu pillar sidewalls, but there are still concerns regarding process costs, adhesion between Sn and underfill, and issues of solder wetting onto sidewalls.

DETAILED DESCRIPTION OF ILLUSTRATIVE EMBODIMENTS

Figure 1A:
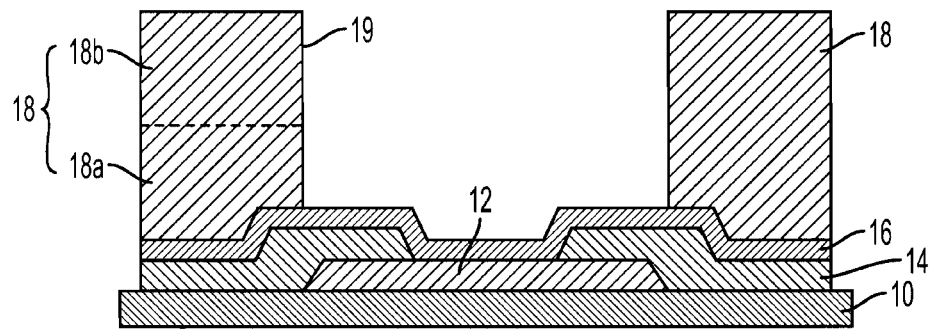
FIGS. 1A-1E are cross-sectional views of a portion of a device at various stages in an integrated circuit manufacturing process in accordance with an exemplary embodiment.

This disclosure provides embodiments of processes of forming a barrier layer on a Cu pillar for conductive bump technology. As employed throughout this disclosure, the term "Cu pillar" refers to a conductive pillar (a post or a standoff) formed of copper or copper alloys. The Cu pillar may be applied over an electrical pad, a redistribution layer on a semiconductor chip for a flip chip assembly, or other similar applications.

Reference will now be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, an apparatus in accordance with the present disclosure. It is to be understood that elements not specifically shown or described may take various forms. Further, when a layer is referred to as being on another layer or "on" a substrate, it may be directly on the other layer or on the substrate, or intervening layers may also be present. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIGS. 1A~1E are cross-sectional views of a portion of a device at various stages in an integrated circuit manufacturing process in accordance with an exemplary embodiment.

With reference to FIG. 1A, an exemplary semiconductor substrate 10 used for bump fabrication is employed in a semiconductor integrated circuit fabrication, and integrated circuits may be formed therein and/or thereupon. The semiconductor substrate 10 is defined to mean any construction comprising semiconductor materials, including, but is not limited to, bulk silicon, a semiconductor wafer, a silicon-on-insulator (SOI) substrate, or a silicon germanium substrate. Other semiconductor materials including group III, group IV, and group V elements may also be used. The substrate 10 may further comprise a plurality of isolation features (not shown), such as shallow trench isolation (STI) features or local oxidation of silicon (LOCOS) features. The isolation features may define and isolate the various microelectronic elements (not shown). Examples of the various microelectronic elements that may be formed in the substrate 10 include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; or other suitable elements. Various processes are performed to form the various microelectronic elements including deposition, etching, implantation, photolithography, annealing, or other suitable processes. The microelectronic elements are interconnected to form the integrated circuit device, such as a logic device, memory device (e.g., static random access memory or SRAM), radio frequency (RF) device, input/output (I/O) device, system-on-chip (SoC) device, combinations thereof, or other suitable types of devices.

The semiconductor substrate 10 further includes inter-layer dielectric layers and a metallization structure overlying the integrated circuits. The inter-layer dielectric layers in the metallization structure include low-k dielectric materials, un-doped silicate glass (USG), silicon nitride, silicon oxynitride, or other commonly used materials. The dielectric constants (k value) of the low-k dielectric materials may be less than about 3.9, or less than about 2.8. Metal lines in the metallization structure may include copper or copper alloys. One skilled in the art will realize the formation details of the metallization structure. A pad region 12 is a top metallization layer formed in a top-level inter-layer dielectric layer, which is a portion of conductive routes and has an exposed surface treated by a planarization process, such as chemical mechanical polishing (CMP), if necessary. Suitable materials for the pad region may include, but are not limited to, for example, copper (Cu), aluminum (Al), AlCu, copper alloy, or other mobile conductive materials. The pad region is used in the bonding process to connect the integrated circuits in the respective chip to external features.

FIG. 1A also shows a passivation layer 14 formed overlying the semiconductor substrate 10 and exposing a portion of the pad region 12 for subsequent bump processes. The passivation layer 14 is formed of a non-organic material selected from un-doped silicate glass (USG), silicon nitride, silicon oxynitride, silicon oxide, or combinations thereof. In some alternative embodiments, the passivation layer 14 is formed of a polymer layer, such as an epoxy, polyimide, benzocyclobutene (BCB), polybenzoxazole (PBO), or the like, although other relatively soft, often organic, dielectric materials can also be used.

FIG. 1A further shows the formation of an under-bump-metallurgy (UBM) layer 16 on the semiconductor substrate 10. For example, the UBM layer 16 is formed on the exposed portion of the pad region 12, and extends over the passivation layer 14. In some embodiments, the UBM layer includes a first layer serving as a diffusion barrier layer or a glue layer, which is formed of titanium, tantalum, titanium nitride, tantalum nitride, or the like by physical vapor deposition (PVD) or sputtering. The first layer is deposited to a thickness of between about 500 and 2000 angstrom. In some embodiments, the UBM layer includes a second layer serving as a seed layer, which is formed of copper or copper alloys by physical vapor deposition (PVD) or sputtering. The second layer is deposited to a thickness of between about 500 and 10000 Angstrom.

FIG. 1A further shows the formation of a mask layer 18 on the UBM layer 16. The mask layer 18 is patterned to form an opening 19 therein so as to expose a portion of the UBM layer 16 for subsequent bump formation. The mask layer 18 may be a dry film or a photoresist film, which may be patterned by lithography and/or etching processes. The mask layer 18 includes a first portion 18a (also referred to as a lower portion) adjacent to the UBM layer 16, and a second portion 18b (also referred to as an upper portion) overlying the first portion 18a, which will be removed in different steps in subsequent processes.

Figure 1B:
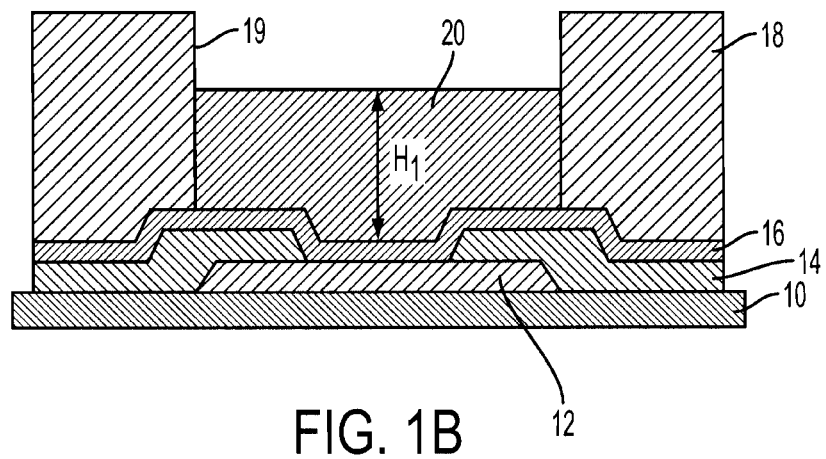

With reference to FIG. 1B, there is shown the formation of a conductive material with solder wettability in the opening 19. In an embodiment, a copper (Cu) layer 20 is formed in the opening 19 to contact the underlying UBM layer 16. As used throughout this disclosure, the term "copper (Cu) layer" is intended to include a layer including substantially pure elemental copper, copper containing unavoidable impurities, or copper alloys containing minor amounts of elements such as tantalum, indium, tin, zinc, manganese, chromium, titanium, germanium, strontium, platinum, magnesium, aluminum, or zirconium. The formation methods may include sputtering, printing, electro plating, electroless plating, or chemical vapor deposition (CVD) methods. For example, electro-chemical plating (ECP) is carried out to form the Cu layer 20. In an exemplary embodiment, the Cu layer 20 has a height $H_1$ measured from the lowest surface to the highest surface, which is greater than 25 μm. In another exemplary embodiment, the height $H_1$ is greater than 40 μm. For example, the height $H_1$ is about 40-50 μm thick, or about 40-70 μm, although the height may be greater or smaller. In some embodiments, the opening 19 is partially filled with the Cu layer 20, thus a top surface 20t of the Cu layer 20 is lower than the top surface of the mask layer 18. In other embodiments, the Cu deposition process may be controlled to fill the opening 19, making the top surface 20t level with or higher than the top surface of the mask layer 18 which are not shown in the figures.

Figure 1C:
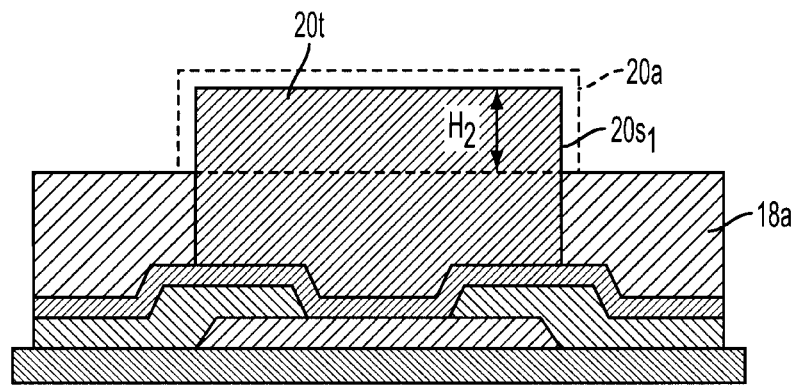

With reference to FIG. 1C, the process proceeds to partially remove the mask layer 18 to expose the upper portion 20a of the Cu layer 20. In some embodiments, the second portion 18b of the mask layer 18 is removed at this step and thereby the upper sidewall surface $20s_1$ is exposed. Accordingly, the upper portion 20a of the Cu layer 20 protrudes from the first portion 18a of the mask layer 18 and has a height $H_2$ greater than about 30 percent of the height $H_1$. In some embodiments, the height $H_2$ greater than or equal to about 50 percent of the height $H_1$.

Figure 1D:
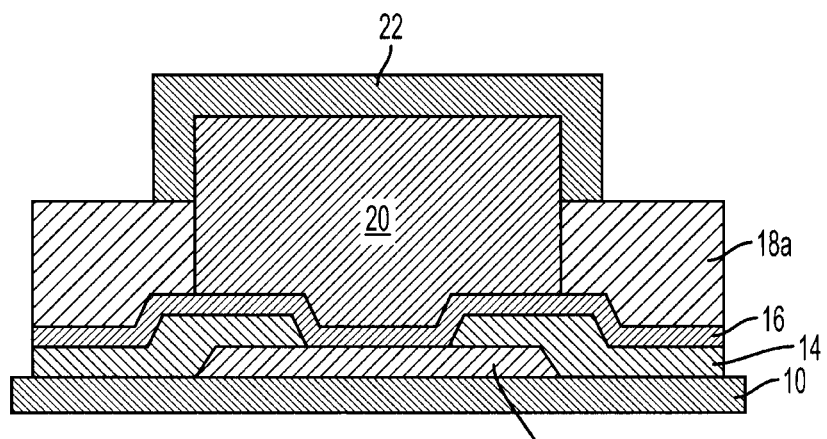

Next, the process proceeds to the formation of a barrier cap on the upper portion 20a of the Cu layer 20. As shown in FIG. 1D, a barrier layer 22 is formed on the exposed surfaces 20t and $20s_1$ of the upper portion 20a of the Cu layer 20. The barrier layer 22 can prevent copper in the Cu layer 20 from diffusing into bonding material, such as solder alloy, that is used to bond the substrate 10 to external features. Also, the barrier layer 22 can prevent the solder alloy from wetting onto the sidewall of the Cu layer 20 so as to increase package reliability. This increases the reliability and bonding strength of the package. In some embodiments, the barrier layer 22 is formed of nickel (Ni) or nickel alloys by an electroplating process, electroless plating process or immersion plating process. In some embodiments, the barrier layer 22 may be formed of nickel (Ni), tin, tin-lead (SnPb), gold (Au), silver, palladium (Pd), indium (In), nickel-palladium-gold (NiPdAu), nickel-gold (NiAu), Ni-base alloy, Au-base alloy, Pd-base alloy, or other similar materials. The barrier layer 22 has a thickness about 0.1~10 μm.

Figure 1E:
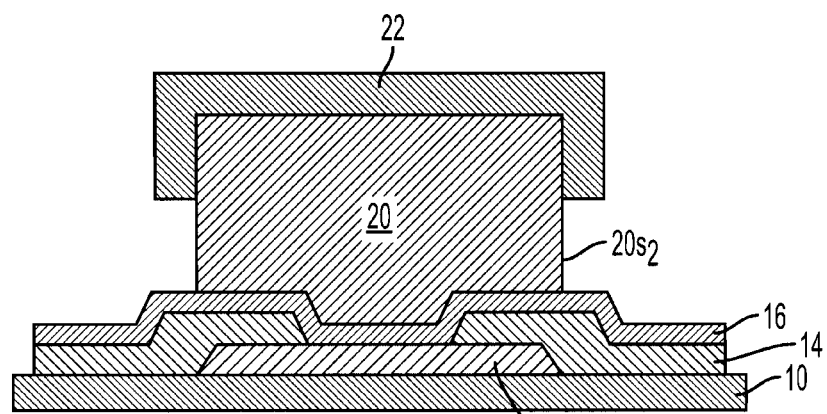

Thereafter, as shown in FIG. 1E, the first portion 18a of the mask layer 18 is removed from the UBM layer 16, and thereby the lower sidewall surface $20s_2$ of the Cu layer 20 is exposed. The Cu layer 20 protruding from the UBM layer 16 is referred to as a Cu pillar 20 hereinafter. The process proceeds with the step of etching the exposed portion of the UBM layer 16, and then the substrate 10 is sawed and jointed onto a package substrate, or another die, with solder balls or Cu bumps mounted on a pad on the package substrate or the other die.

The disclosure provides the method of two-step removal of the mask layer 18 to define the surface regions of the Cu pillar 20 for forming the barrier layer 22 thereon. The deposition alignment of the barrier layer 22 can be well controlled. This is applicable to fine pitch bump schemes. The barrier layer 22 therefore caps the top surface 20t and the upper sidewall surface $20s_1$ of the Cu pillar 20 to prevent solder wetting onto the Cu pillar sidewall in subsequent solder jointing processes. The barrier layer 22 also prevents copper diffusion from the Cu pillar into the bonding material. The Cu pillar 20 capped by the barrier layer 22 and the method of forming thereof can decrease the probability of bump collapse and increase the package reliability performance.

FIGS. 2A-2E are cross-sectional views of a portion of a semiconductor device at various stages in an integrated circuit manufacturing process in accordance with another exemplary embodiment. The explanation of the same or similar portions to the description in FIGS. 1A-1E will be omitted.

Figure 2A:
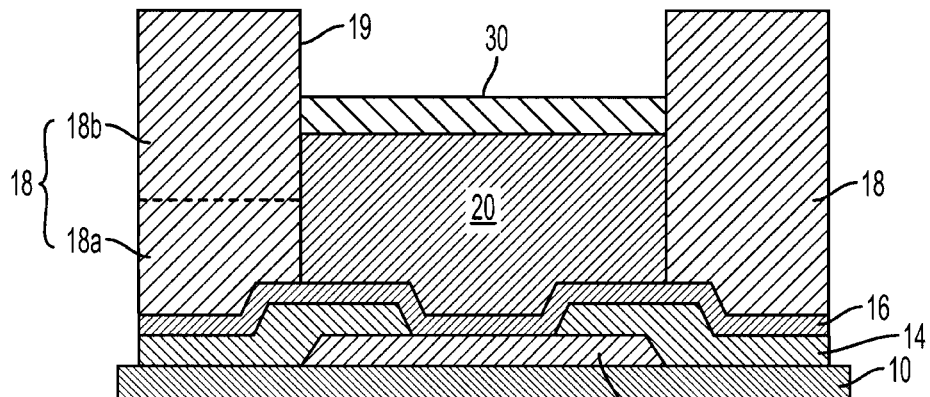
FIGS. 2A-2F are cross-sectional views of a portion of a device at various stages in an integrated circuit manufacturing process in accordance with an exemplary embodiment.

With reference to FIG. 2A, there is shown a cap layer 30 formed on the top surface 20t of the Cu layer 20 in the opening 19 before the step of removing the second portion 18b of the mask layer 18. The cap layer 30 could act as a barrier layer to prevent copper in the Cu pillar from diffusing into bonding material, such as solder alloy, that is used to bond the substrate 10 to external features. The prevention of copper diffusion increases the reliability and bonding strength of the package. The cap layer 30 may include at least one of nickel (Ni), tin, tin-lead (SnPb), gold (Au), silver, palladium (Pd), indium (In), nickel-palladium-gold (NiPdAu), nickel-gold (NiAu), other similar materials, or alloys deposited by plating methods. The cap layer 30 has a thickness about 1-10 μm. In some embodiments, the cap layer 30 is a multi-layer structure, and each layer includes at least one of Ni, Au, Pd, Ni-base alloy, Au-base alloy, or Pd-base alloy. In some embodiments, the cap layer 30 is a Ni film or a Ni alloy film formed by an electroplating process, electroless plating process or immersion plating process.

Figure 2B:
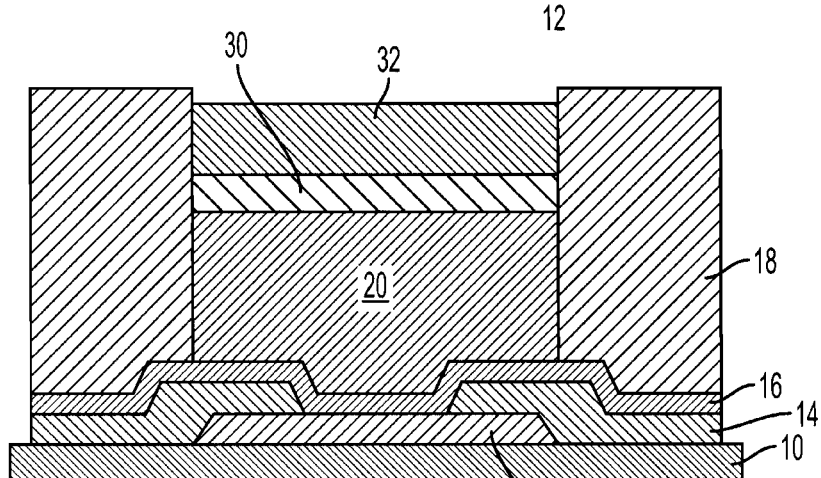

With reference to FIG. 2B, there is shown a solder layer 32 formed on the top surface of the cap layer 30 in the opening 19 before the step of removing the second portion 18b of the mask layer 18. The solder layer 32 may be made of Sn, SnAg, Sn—Pb, SnAgCu (with Cu weight percentage less than 0.3%), SnAgZn, SnZn, SnBi—In, Sn—In, Sn—Au, SnPb, SnCu, SnZnIn, or SnAgSb, etc., formed by plating processes. In some embodiments, the solder layer 32 is a lead-free solder layer. For a lead-free solder system, the solder layer is SnAg with Ag content being controlled lower than 3.0 weight percent (wt %). In some embodiments, the lead-free solder layer is SnAg with Ag content being controlled at about 2.5 weight percent (wt %).

Figure 2C:
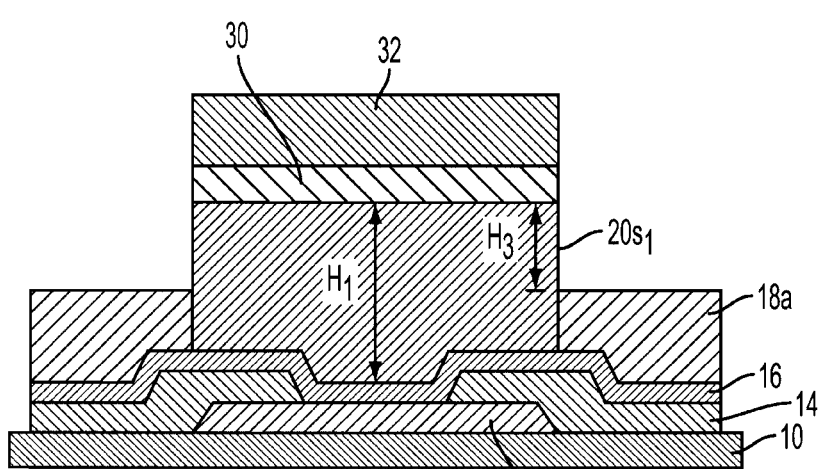

With reference to FIG. 2C, the process proceeds to partially remove the mask layer 18 to expose the solder layer 32, the cap layer 30 and the upper sidewall surface $20s_1$ of the Cu layer 20. In some embodiments, the second portion 18b of the mask layer 18 is removed at this step. Accordingly, the upper sidewall surface $20s_1$ of the Cu layer 20 protrudes from the first portion 18a of the mask layer 18 and has a height $H_3$ greater than about 30 percent of the height $H_1$. In some embodiments, the height $H_3$ greater than or equal to about 50 percent of the height $H_1$.

Figure 2D:
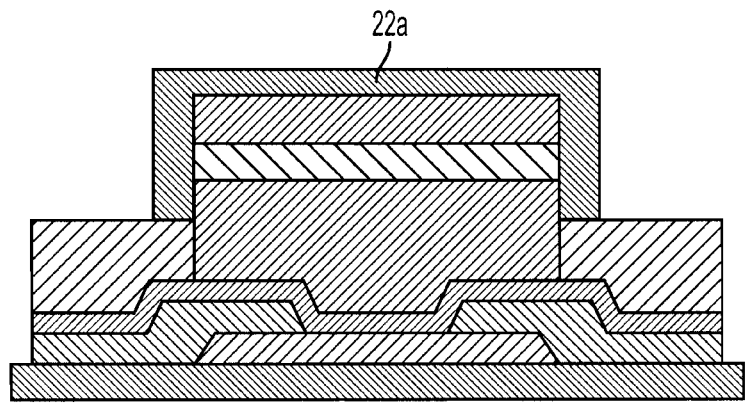

Next, the process proceeds to the formation of a barrier cap on the upper sidewall surface $20s_1$ of the Cu layer 20. As shown in FIG. 2D, a barrier layer 22a is formed on the exposed surfaces of the solder layer 32, the cap layer 30 and the upper sidewall surface $20s_1$ of the Cu layer 20. The barrier layer 22a can prevent copper in the Cu layer 20 from diffusing into bonding material, such as solder alloy, that is used to bond the substrate 10 to external features. Also, the barrier layer 22a can prevent the solder alloy from wetting onto the sidewall of the Cu layer 20 so as to increase package reliability. This increases the reliability and bonding strength of the package. In some embodiments, the barrier layer 22a is formed of nickel (Ni) or nickel alloys by an electroplating process, electroless plating process or immersion plating process. In some embodiments, the barrier layer 22a may be formed of nickel (Ni), tin, tin-lead (SnPb), gold (Au), silver, palladium (Pd), indium (In), nickel-palladium-gold (NiPdAu), nickel-gold (NiAu), Ni-base alloy, Au-base alloy, Pd-base alloy, or other similar materials. The barrier layer 22a has a thickness about 0.1~10 μm.

Figure 2E:
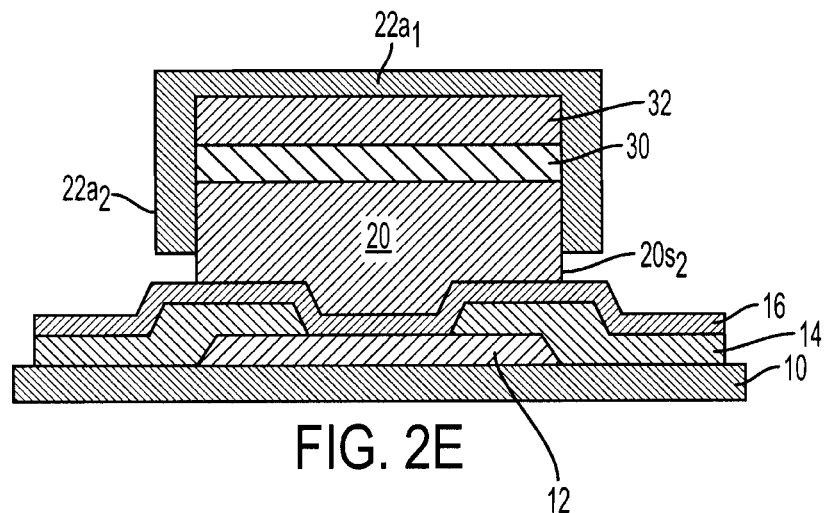

Thereafter, as shown in FIG. 2E, the first portion 18a of the mask layer 18 is removed from the UBM layer 16, and thereby the lower sidewall surface $20s_2$ of the Cu layer 20 is exposed. The Cu layer 20 protruding from the UBM layer 16 is referred to as a Cu pillar 20 hereinafter.

Figure 2F:
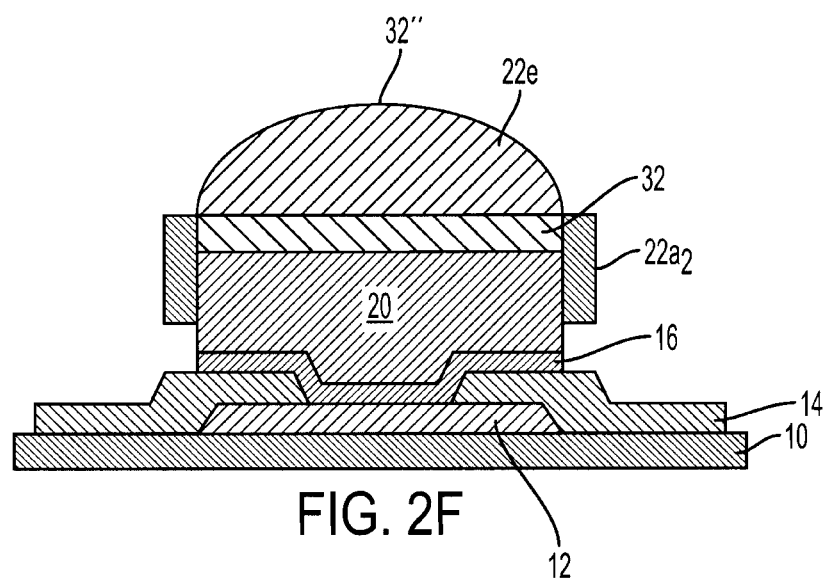

The process proceeds with the step of etching the exposed portion of the UBM layer 16 followed by a solder reflow process. With reference to FIG. 2F, using the Cu pillar 20 as the mask, an etching process is performed to remove the exposed portion of the UBM layer 16, exposing the underlying passivation layer 14. A reflowing process is then performed on the solder layer 32 to form a reflowed solder layer 32" on the cap layer 30. During the reflow step, a portion $22a_1$ of the barrier layer 22a directly on the solder layer 32 diffuses into the reflowed solder layer 32", leaving a portion $22a_2$ of the barrier layer 22a on the upper sidewall portion $20s_1$ of the Cu pillar 20. The portion $22a_2$ may remain on the sidewall of the cap layer 30. Thus, the reflowed solder layer 32" includes metal elements 22e of the barrier layer 22a. In some embodiment, the reflowed solder layer 32" includes Ni elements. In some embodiments, the reflowed solder layer 32" includes the elements Au, Pd, or In. The substrate 10 is then sawed and packaged onto a package substrate, or another die, with solder balls or Cu bumps mounted on a pad on the package substrate or the other die.

The disclosure provides a method of two-step removing the mask layer 18 to define the surface regions of the solder layer 32, the cap layer 30 and the Cu pillar 20 for forming the barrier layer 22a thereon. The deposition alignment of the barrier layer 22a can be well controlled. This is applicable to fine pitch bump schemes. The barrier layer 22a caps the upper sidewall surface $20s_1$ of the Cu pillar 20 to prevent solder wetting onto the Cu pillar sidewall in subsequent solder jointing processes. The barrier layer 22a also prevents copper diffusion from the Cu pillar into the bonding material. The Cu pillar 20 capped by the barrier layer 22a and the method of forming thereof can decrease the probability of bump collapse and increase the package reliability performance.

One aspect of this description relates to a method of forming an integrated circuit device. The method includes forming a mask layer overlying an under bump metallurgy (UBM) layer, wherein the mask layer comprises a first portion adjacent to the UBM layer, and a second portion overlying the first portion. The method further includes forming an opening in the mask layer to expose a portion of the UBM layer. The method further includes forming a conductive layer in the opening of the mask layer, electrically connected to the exposed portion of the UBM layer. The method further includes removing the second portion of the mask layer to expose an upper portion of the conductive layer. The method further includes forming a barrier layer on the exposed upper portion of the conductive layer.

Another aspect of this description relates to a method of forming an integrated circuit. The method includes forming a copper-containing pillar on a semiconductor substrate. The copper-containing pillar includes a top surface, an upper sidewall surface adjacent to the top surface, and a lower sidewall surface adjacent to the semiconductor substrate. The method further includes plating a barrier layer over the top surface and the upper sidewall surface of the copper-containing pillar. Plating the barrier layer over the upper sidewall surface of the copper-containing pillar includes exposing the lower sidewall surface, and a height of the lower sidewall surface is less than about 70 percent of a height of the copper-containing pillar.

Still another aspect of this description relates to a method of forming an integrated circuit. The method includes forming a copper-containing pillar over a semiconductor substrate, wherein the copper-containing pillar comprises a top surface and a sidewall surface. The method further includes plating a nickel-containing barrier layer over the top surface of the copper-containing pillar. Plating the nickel-containing barrier layer includes covering a first portion of the sidewall surface of the copper-containing pillar, and exposing a second portion of the sidewall surface of the copper-containing pillar adjacent to the semiconductor substrate.

In the preceding detailed description, the disclosure is described with reference to specific exemplary embodiments thereof. It will, however, be evident that various modifications, structures, processes, and changes may be made thereto without departing from the broader spirit and scope of the disclosure. The specification and drawings are, accordingly, to be regarded as illustrative and not restrictive. It is understood that the disclosure is capable of using various other combinations and environments and is capable of changes or modifications within the scope of the inventive concepts as expressed herein.

What is claimed is:

1. A method of forming an integrated circuit device, comprising:

forming a mask layer overlying an under bump metallurgy (UBM) layer, wherein the mask layer comprises a first portion adjacent to the UBM layer, and a second portion overlying the first portion;

forming an opening in the mask layer to expose a portion of the UBM layer;

forming a copper-containing pillar in the opening of the mask layer electrically connected to the exposed portion of the UBM layer;

removing the second portion of the mask layer to expose an upper portion of the copper-containing pillar; and plating a barrier layer on the exposed upper portion of the conductive layer.

2. The method of claim 1, further comprising forming the UBM layer, wherein the UBM layer comprises a diffusion barrier layer and a seed layer overlying the diffusion barrier layer.

3. The method of claim 2, wherein forming the UBM layer comprises forming the diffusion barrier layer using a physical vapor deposition (PVD) process and forming the seed layer using a PVD process.

4. The method of claim 1, wherein forming the copper-containing pillar comprises forming a copper alloy layer.

5. The method of claim 4, wherein forming the copper alloy layer comprises forming a layer comprising copper and at least one of tantalum, indium, tin, zinc, manganese, chromium, titanium, germanium, strontium, platinum, magnesium, aluminum or zirconium.

6. The method of claim 1, further comprising forming a cap layer between a top surface of the copper-containing pillar and the barrier layer, wherein forming the cap layer comprises forming a layer comprising at least one of nickel, tin, tin-lead, gold, silver, palladium, indium, nickel-palladium-gold, or nickel-gold.

7. The method of claim 1, further comprising forming a cap layer between a top surface of the copper-containing pillar and the barrier layer, wherein forming the cap layer comprises forming the cap layer using electroplating, electroless plating, or immersion plating.

8. A method of forming an integrated circuit, the method comprising:

forming a copper-containing pillar on a semiconductor substrate, wherein the copper-containing pillar comprises a top surface, an upper sidewall surface adjacent to the top surface, and a lower sidewall surface adjacent to the semiconductor substrate; and plating a barrier layer over the top surface and the upper sidewall surface of the copper-containing pillar, wherein plating the barrier layer over the upper sidewall surface of the copper-containing pillar comprises exposing the lower sidewall surface, and a height of the lower sidewall surface is less than about 70 percent of a height of the copper-containing pillar.

9. The method of claim 8, wherein plating the barrier layer comprises electroplating, electroless plating or immersion plating.

10. The method of claim 8, wherein forming the copper-containing pillar comprises forming the copper containing pillar in an opening defined in a mask layer.

11. The method of claim 10, wherein plating the barrier layer comprises:

reducing a height of the mask layer to expose the upper sidewall surface of the copper-containing pillar; and plating the barrier layer over the exposed upper sidewall surface.

12. The method of claim 11, further comprising removing the mask layer following plating the barrier layer to expose the lower sidewall surface of the copper-containing pillar.

13. The method of claim 8, further comprising forming a solder layer over the top surface of the copper-containing pillar, wherein the solder layer is between the copper-containing pillar and the barrier layer.

14. The method of claim 13, further comprising reflowing the solder layer, wherein reflowing the solder layer comprises dissolving a portion of the barrier layer over the solder layer.

15. The method of claim 14, wherein dissolving the portion of the barrier layer over the solder layer comprises maintaining the barrier layer over the upper sidewall surface of the copper-containing pillar.

16. A method of forming an integrated circuit, the method comprising:
    forming a copper-containing pillar over a semiconductor substrate, wherein the copper-containing pillar comprises a top surface and a sidewall surface; and
    plating a nickel-containing barrier layer over the top surface of the copper-containing pillar, wherein plating the nickel-containing barrier layer comprises:
        covering a first portion of the sidewall surface of the copper-containing pillar, and
        exposing a second portion of the sidewall surface of the copper-containing pillar adjacent to the semiconductor substrate.

17. The method of claim 16, further comprising plating a cap layer over the top surface of the copper-containing pillar, wherein the cap layer is between the copper-containing pillar and the nickel-containing barrier layer.

18. The method of claim 17, further comprising forming a solder layer over the cap layer, wherein the solder layer is between the cap layer and the nickel-containing barrier layer.

19. The method of claim 18, further comprising reflowing the solder layer, wherein reflowing the solder layer comprises dissolving a portion of the nickel-containing barrier layer over the top surface of the copper-containing layer.

20. The method of claim 16, further comprising etching an under bump metallurgy (UBM) layer between the copper-containing pillar and the semiconductor substrate after plating the nickel-containing barrier layer.

* * * * *